(12) United States Patent
Blanchard et al.

(10) Patent No.: US 11,624,772 B2
(45) Date of Patent: Apr. 11, 2023

(54) METHODS AND SYSTEMS FOR IDENTIFYING A MALFUNCTIONING CURRENT SENSOR

(71) Applicant: Schneider Electric Industries SAS, Rueil Malmaison (FR)

(72) Inventors: Pierre Blanchard, Voreppe (FR); Jean-Baptiste Bernard, Seyssins (FR); Stéphane Sicard, Saint Jean de Vaux (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 16 days.

(21) Appl. No.: 17/482,552

(22) Filed: Sep. 23, 2021

(65) Prior Publication Data

US 2022/0099728 A1 Mar. 31, 2022

(30) Foreign Application Priority Data

Sep. 30, 2020 (FR) .................................. FR2009985

(51) Int. Cl.
  *G01P 3/48* (2006.01)
  *G01R 31/28* (2006.01)
  *G01R 31/26* (2020.01)

(52) U.S. Cl.
  CPC ..... *G01R 31/2827* (2013.01); *G01R 31/2617* (2013.01)

(58) Field of Classification Search
  CPC ........ G01R 31/50; G01R 31/52; G01R 31/56; G01R 31/2617; G01R 31/2827; G01R 19/0092; G01R 19/165; G01R 19/16566; G01R 19/22; G01R 19/2513; H02H 3/08; H02H 3/044
  See application file for complete search history.

(56) References Cited

U.S. PATENT DOCUMENTS

| | | | |
|---|---|---|---|
| 6,141,198 A | 10/2000 | Zuzuly | |
| 6,396,716 B1 * | 5/2002 | Liu | H02M 3/33571 363/17 |
| 2011/0025515 A1 | 2/2011 | Suthar et al. | |

(Continued)

FOREIGN PATENT DOCUMENTS

DE 3223687 A1 1/1984

OTHER PUBLICATIONS

French Search Report and Written Opinion dated Jul. 5, 2021 for corresponding French Patent Application No. 2009985, 7 pages.

*Primary Examiner* — Thang X Le
(74) *Attorney, Agent, or Firm* — Locke Lord LLP (57) ABSTRACT

A method for identifying a malfunctioning current sensor in an electrical apparatus, in which an electrical power supply of the electrical apparatus is at least partly supplied by a switched-mode electrical power supply circuit connected to at least one current sensor which samples an electrical current in a phase conductor of an electrical installation, the power supply circuit delivering a regulated electrical voltage, the method including:
  determining a switching duty cycle of a power switch of the switched-mode electrical power supply;
  analysing the determined switching duty cycle; and
  identifying a failure condition if the behaviour of the switching duty cycle is representative of a malfunctioning of at least one of the current sensors.

13 Claims, 6 Drawing Sheets

(56) References Cited

U.S. PATENT DOCUMENTS

| | | |
|---|---|---|
| 2011/0234255 A1 | 9/2011 | Chobot |
| 2014/0354266 A1* | 12/2014 | Hurwitz ............. G01R 19/0092 |
| | | 324/140 R |
| 2015/0137782 A1* | 5/2015 | Wang .................... H02M 3/156 |
| | | 323/282 |
| 2020/0191841 A1 | 6/2020 | Lakirovich et al. |
| 2020/0195008 A1* | 6/2020 | Cheng ..................... H02J 3/003 |

* cited by examiner

METHODS AND SYSTEMS FOR IDENTIFYING A MALFUNCTIONING CURRENT SENSOR

TECHNICAL FIELD

The invention relates to methods and systems for identifying a malfunctioning current sensor in an electrical apparatus.

The invention relates more particularly to the field of electrical protection devices and/or of electrical measurement devices, such as those used in electricity distribution installations, notably in installations used to distribute an AC electrical current.

BACKGROUND

Such electrical devices are generally associated with one or more phase conductors of the electrical installation, for example in order to be able to interrupt the flow of the electrical current in these phase conductors in the case of occurrence of an electrical fault.

In a known manner, some of these devices may be at least partly electrically supplied by the current flowing in the phase conductors. These devices are said to be self-powered. The electrical current needed for the operation of the electrical apparatus may, for example, be sampled by means of current sensors, such as current transformers installed around each of the phase conductors. Thus, the apparatus does not need to be electrically powered by a dedicated electrical supply line or by an on-board battery. Nor is it necessary to create a direct electrical connection between the phase conductors and the electrical apparatus.

This considerably simplifies the fabrication of the apparatus, together with its assembly within the electrical installation.

These self-powered devices have the drawback that, in the case of a fault in one of the current sensors, the apparatus runs the risk of not being correctly powered, which may compromise its correct operation and may pose an unacceptable safety problem.

SUMMARY

It is these drawbacks that the invention more particularly aims to overcome by providing devices and methods for identifying a malfunctioning current sensor in an electrical apparatus, notably in an electrical protection apparatus.

For this purpose, one aspect of the invention relates to a method for identifying a malfunctioning current sensor in an electrical apparatus, in which the electrical power for the electrical apparatus is at least partly supplied by a switch-mode electrical power supply circuit connected to at least one current sensor which samples an electrical current in a phase conductor of an electrical installation, the power supply circuit delivering a regulated electrical voltage, in which the method comprises steps consisting in:
  determining a switching duty cycle of a power switch of the switch-mode electrical power supply;
  analysing the switching duty cycle determined;
  identifying a failure condition if the behaviour of the switching duty cycle is representative of a failure of at least one of the current sensors.

By virtue of the invention, the diagnostic device allows an anomaly in the operation of a current sensor likely to compromise the correct operation of the apparatus to be detected.

According to advantageous, but non-essential, aspects, such methods and systems may incorporate one or more of the following features, taken in isolation or according to any technically admissible combination:
  The analysis of the switching duty cycle comprises a comparison of the switching duty cycle determined with a predetermined reference value.
  The predetermined reference value is chosen as a function of the amplitude of the current flowing in the phase conductors.
  The analysis of the switching duty cycle comprises an analysis of the variation of the duty cycle over time with respect to a history of past values.
  The analysis of the variation over time is carried out by means of an infinite pulse response filter.
  The analysis of the switching duty cycle comprises a comparison of the switching duty cycle determined with a theoretical value of the comparison duty cycle calculated using values of current measured by means of one or of several additional current sensors.
  The duty cycle determined is an average value of the switching duty cycle averaged over a predefined period of time, for example over a period of time corresponding to several periods of the current flowing in the phase conductors.
  An alarm is automatically raised if a failure condition is identified.
  The electrical apparatus is an electrical protection apparatus, such as a circuit breaker, and in which the apparatus is automatically triggered if a failure condition is identified.
  The method for identifying a malfunctioning sensor furthermore comprises steps consisting in:
    measuring the value of the total current flowing in the phase conductor or conductors of the electrical installation, by means of one or of several additional current sensors;
    measuring the total current coming from said at least one current sensor, then comparing the values of total current measured with the values of current measured by the additional sensor or sensors;
    identifying a failure condition if the difference between the values of total current coming from said at least one current sensor and the values of current measured by the additional sensor or sensors is greater than a predefined threshold.

According to another aspect, the electrical apparatus comprises:
  at least one current sensor designed to sample an electrical current in a phase conductor of an electrical installation, and
  a switch-mode electrical power supply circuit connected to said current sensors and being configured for delivering a regulated electrical voltage for powering the electrical apparatus. The electrical apparatus comprises a diagnostic device configured for implementing steps consisting in:
  determining a switching duty cycle of a power switch of the switch-mode electrical power supply;
  analysing the switching duty cycle determined; and in
  identifying a failure condition if the behaviour of the switching duty cycle is representative of a failure of at least one of the current sensors.

BRIEF DESCRIPTION OF THE DRAWINGS

The invention will be better understood and other advantages of the latter will become more clearly apparent in light of the description that follows of one embodiment of an electrical protection or measurement apparatus given solely by way of example and with reference to the appended drawings, in which.

DETAILED DESCRIPTION

Figure 1:
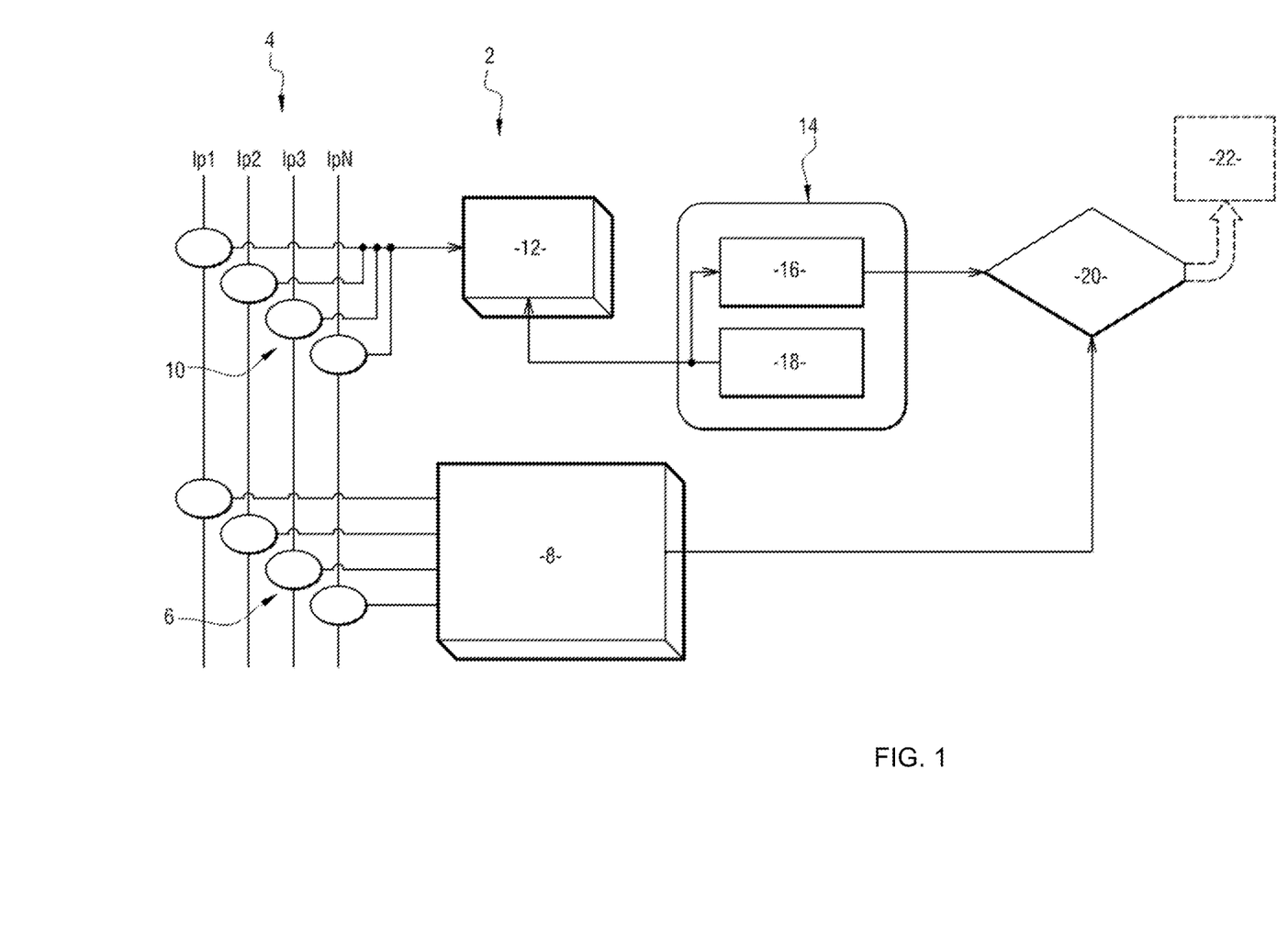
FIG. 1 is a simplified schematic circuit diagram of an electrical apparatus associated with an electrical installation and comprising a diagnostic device according to embodiments of the invention.

FIG. 1 shows a diagnostic device 2 on board an electrical apparatus (not shown), such as an electrical protection apparatus or an electrical measurement apparatus. For example, the electrical apparatus may be a circuit breaker.

The electrical apparatus is configured so as to be associated with an electrical installation 4, such as an electricity distribution installation.

The electrical installation comprises one or more phase conductors designed to carry an AC electrical current.

In the example illustrated, the electrical installation 4 comprises three phase conductors, denoted Ip1, Ip2 and Ip3, for carrying a three-phase electrical current, together with a neutral conductor, denoted IpN, and which, in the following, will correspond to a phase conductor.

This example is non-limiting and, as a variant, the number of phase conductors could be different. The phase conductor associated with the neutral IpN could be omitted.

The electrical apparatus comprises a first group of current sensors 6, each coupled to a phase conductor Ip1, Ip2, Ip3 and IpN.

For example, the current sensors 6 are measurement coils, such as Rogowski coils, or current transformers, or any other analogous type of sensor.

According to one exemplary embodiment, each current sensor 6 comprises a core, which may be magnetic or non-magnetic (as is the case for Rogowski coils), surrounding the phase conductor and a coil wound around the core whose opposing ends form output terminals of the current sensor 6.

Each current sensor 6 is configured for delivering an electrical current when the phase conductor around which it is installed is carrying an electrical current.

Here, the current sensors 6 are connected to an electronic processing circuit 8, configured for analysing the currents measured by the current sensors 6.

For example, the electronic processing circuit 8 allows the apparatus to implement functions for monitoring and measuring the current flowing in the electrical installation 4.

By way of example, the electronic processing circuit 8 may be connected to a tripping device of the electrical apparatus.

The electrical apparatus also comprises a second group of current sensors 10, each of these current sensors 10 being coupled to one of said phase conductors Ip1, Ip2, Ip3 and IpN.

For example, the current sensors 10 are sensors based on magnetic cores (such as current transformers) and the current sensors 6 are Rogowski coils.

The electrical apparatus also comprises a switch-mode power supply circuit 12 configured for delivering an electrical power supply voltage, in the following referred to as "output voltage", which is used to at least partly supply the electrical apparatus using the electrical current coming from current sensors 10.

In other words, the current sensors 10 allow the apparatus 2 to be powered from the line current flowing in the phase conductors.

More particularly, the power supply circuit 12 is configured for at least powering measurement and/or monitoring and/or protection functions provided by the electrical apparatus, for example for supplying a tripping device of the electrical apparatus.

For example, the electrical power supply circuit 12 may comprise a power converter and/or a filter circuit and/or a rectifier.

Notably, the power supply circuit 12 comprises a switch-mode power converter configured for converting the AC voltages obtained at the output of the current sensors 10 into a regulated electrical voltage, preferably a DC voltage.

Advantageously, the electrical power supply circuit 12 comprises at least one power switch, such as a power transistor.

For example, the switching of this power switch allows the output electrical voltage to be rectified, as will be understood from the following.

In many embodiments, the electrical power supply circuit 12 comprises several such power switches.

In the following, for the sake of simplicity, only one such power switch will be described. It will nevertheless be understood that the embodiments described hereinafter may be generalized to the case where the electrical power supply circuit 12 comprises several such power switches.

The electrical power supply circuit 12 may also comprise an energy storage, such as a capacitor, as explained hereinafter.

Generally speaking, the diagnostic device 2 is configured for identifying a failure of one of the current sensors 10 and/or a failure of the power supply circuit 12. For this purpose, the diagnostic device 2 may be based on the measurements coming from the groups of current sensors 6 and 10.

For this purpose, according to embodiments illustrated in the schematic circuit diagram in FIG. 1, the diagnostic device 2 comprises a second electronic processing circuit 14 (also referred to as control circuit), which here comprises:
  a first processing module 18 configured for generating a control signal used to control said at least one power switch of the electrical power supply circuit 12, and
  a second processing module 16 configured for calculating a duty cycle for operation of the electrical power supply circuit 12, and notably a switching duty cycle of said at least one transistor of the electrical power supply circuit 12.

In practice, the duty cycle calculated by the second processing module 16 can depend on the switching frequency of the power switch. In other words, the duty cycle calculated can vary over time.

For example, the second processing module 16 may determine the duty cycle directly from the control signal coming from the first processing module 18, for example by measuring this signal or else by having access to the data used internally by the first processing module 18 for generating the control signal.

According to another example, as will be seen hereinbelow with reference to FIG. 6, the second processing module 16 may measure the electrical current flowing through said power switch. This measurement may be carried out by means of a measurement resistance (shunt resistance) connected in series with said power switch.

In many embodiments, the first processing module 18 is programmed for controlling the power switch in order to maintain the output voltage of the electrical power supply circuit 12 regulated at a reference value of electrical voltage or, as a variant, within a reference interval of voltages.

In other words, the regulation of the output voltage is controlled by the processing circuit 14 (and notably by the first processing module 18). The processing circuit 14 may implement a control law such as a feedback loop.

For example, the output voltage is regulated so as to be maintained at a value close or equal to 20 Volts. This exemplary value is non-limiting, and other values of setpoint voltage could be chosen depending on the desired applications.

The diagnostic device 2 also comprises a diagnostic module 20 configured for identifying a failure of a sensor based on the duty cycle calculated (or determined) by the second processing module 16.

It will notably be understood that this duty cycle calculated by the second processing module 16 is a setpoint value and that it is regularly re-calculated as a function of the variations of the electrical voltage obtained at the output of the power supply circuit 12.

Preferably, the diagnostic module 20 is configured for comparing the duty cycle calculated by the second processing module 16 with a theoretical duty cycle calculated using the values measured by the current sensors 6 of the first group. The theoretical duty cycle may be calculated by the processing circuit 8.

Other methods may however by used.

The operation of the diagnostic module 20 will be described in detail hereinbelow in the following.

The diagnostic device 2 also comprises an alarm module 22, for example configured for raising an alarm when the comparison carried out by the comparison module 20 leads to the identification of a failure of one or of several current sensors 10.

According to examples, the alarm module 22 may be programmed for activating an indicator light disposed on the front panel of the electrical apparatus and/or for displaying a message on a human/machine interface of the electrical apparatus, where this interface may comprise a display screen or a touchscreen. The alarm module 22 may also be configured for sending an alarm message to a remote apparatus, for example by means of a wired telecommunications link or a radio telecommunications link.

For example, the alarm module 22 may comprise or be connected to a human/machine interface, or to network equipment, or to radiofrequency communications equipment, such as a radio transmitter/receiver, or to a radio hub or a network gateway, or to a programmable logic controller, and there are many other examples.

The alarm message generated by the alarm module 22 may contain, aside from the information on the presence of the malfunction, information on the nature of the malfunction, or information on the identification of the current sensor or sensors 10 which are malfunctioning.

In many embodiments, the processing circuit 14 is implemented by one or more electronic circuits.

The comparison 20 and alarm 22 functions may also be implemented by electronic circuits, for example by the same electronic circuit as that of the processing circuit 14. As a variant, the comparison 20 and alarm 22 functions may be implemented by software means.

The processing circuit 8 associated with the first group of current sensors 6 may also be implemented by the same electronic device as the processing circuit 14.

According to exemplary embodiments, the processing circuit 14 comprises a processor, such as a programmable microcontroller or a microprocessor. The processor is coupled to a computer memory, or to any data storage medium readable by a suitable computer, which comprises executable instructions and/or a software code provided for implementing a method according to the invention when these instructions are executed by the processor.

According to variants, the processing circuit 14 may comprise a processor for processing the signal (DSP), or a reprogrammable logic component (FPGA), or a specialized integrated circuit (ASIC), or any equivalent element.

Other architectures may however be used to implement the processing modules 16 and 18.

Figure 2:
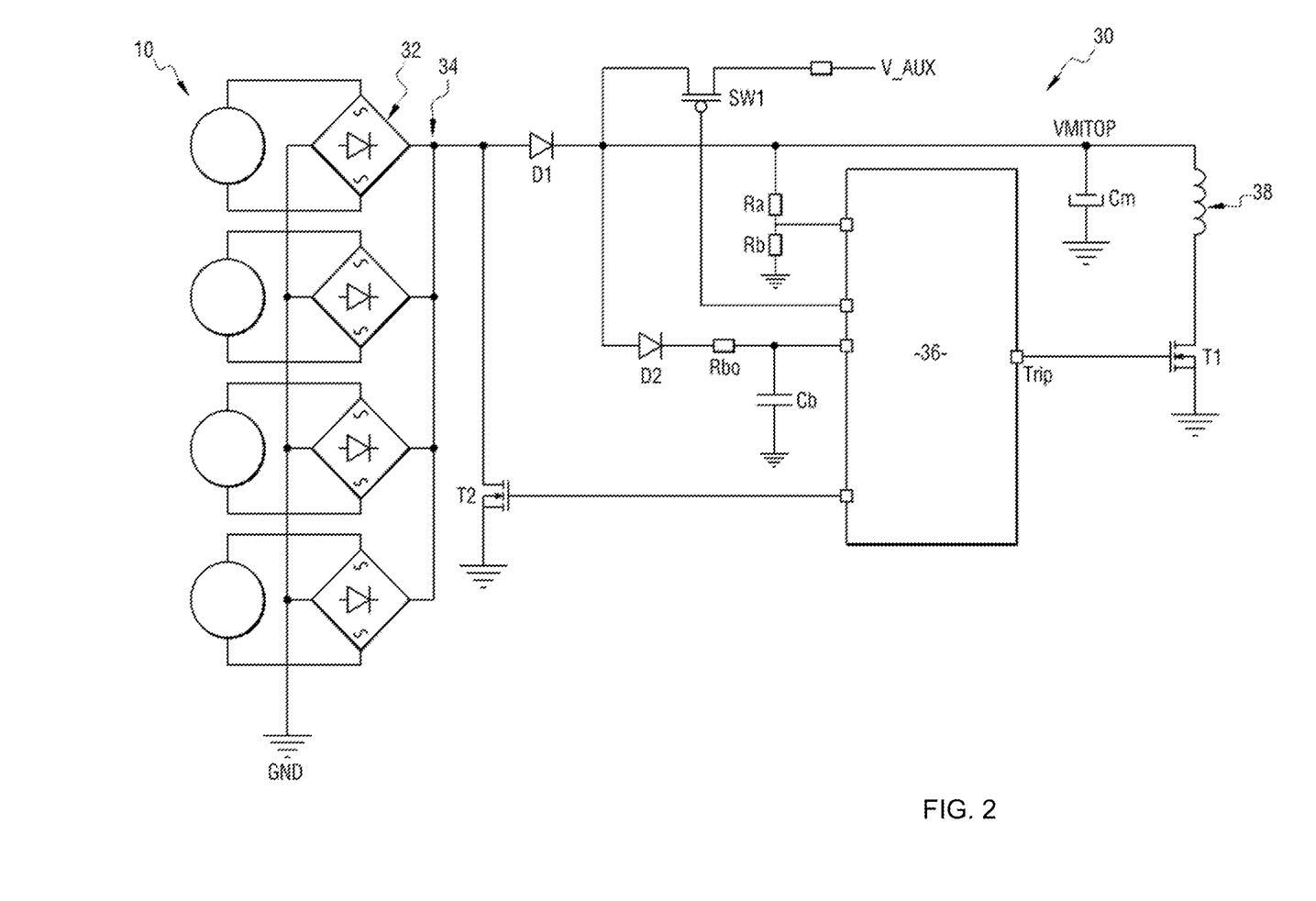
FIG. 2 shows schematically one embodiment of the diagnostic device in FIG. 1.

One exemplary embodiment of the processing circuit 14 is illustrated in FIG. 2.

In some embodiments, as described in the following, the electrical apparatus may comprise an electronic control circuit, which carries the reference 30 here.

In the embodiment illustrated, the electronic control circuit 30 is connected to the output of the current sensors 10. For each current sensor 10, a rectifier bridge 32 is connected to the output of the corresponding sensor 10. The respective outputs of the rectifier bridges 32 are connected to a common point 34.

For example, the rectifier bridges 32 form part of the electrical power supply circuit 12.

The power switch previously described, which here carries the reference T2, also forms part of the electrical power supply circuit 12.

The power switch T2 is connected between the point 34 and an electrical ground of the circuit 30, which is denoted GND here.

The power switch T2 may be a transistor, such as a field-effect transistor. As a variant, other technologies could be used, such as a bipolar transistor, or an isolated gate bipolar transistor (IGBT), or a relay, and there are many other examples.

In the following, the power switch T2 will be referred to as "transistor T2".

The electronic control circuit 30 also comprises a processor 36 such as previously explained and which centralizes all the data processing functions of the electrical apparatus.

For example, the functionalities of the processing circuit 14 and of the modules 20 and 22 here are implemented by the circuit 30. However, this example is non-limiting and other implementations are possible.

In addition, in the example illustrated, the circuit 30 may implement other functions, such as protection functions, for example for controlling the opening of separable electrical contacts of the apparatus with a view to interrupting the flow of the current in the phase conductors Ip1, Ip2, Ip3 and IpN of the electrical installation 4. These additional functions may however be omitted.

In many embodiments, the electronic control circuit 30 comprises a conductor forming a power supply rail connected to the input point. This power supply rail is denoted VMITOP in FIG. 2.

The common point 34 is connected to an output of the control circuit 12, which here is connected to an input of the circuit 30.

An energy storage Cm, such as a capacitor, is connected between the power supply rail and the ground GND. This energy storage Cm may be charged or discharged according to the variation of the output voltage over time. For example, this contributes to transforming the current supplied by the sensors 10 into a smoothed power supply voltage.

In the example illustrated, a diode D1 is connected to the power supply rail in order to avoid a return of current to the transistor T2 and hence to avoid completely discharging the energy storage Cm.

The control electrode of the transistor T2 is connected to a first output of the processor 36, the latter thus being configured for switching the transistor T2 between its on and off states.

Generally speaking, the power supply rail is notably configured for electrically supplying at least one or more components of the electrical apparatus, such as the processor 36.

For example, as can be seen in FIG. 2, a power supply input of the processor 36 is connected to said power supply rail via a second diode D2, a resistor Rbo and a capacitor Cb.

More precisely, in the example illustrated, the resistor Rbo and the diode D2 are connected in series between the power supply rail and the auxiliary power supply input of the processor 36. A capacitor Cb is connected between the resistor Rbo and the ground GND.

In some embodiments, as illustrated in FIG. 1, a coil 38 may be connected in series with a second power switch T1.

The coil 38 is for example a coil of an electromagnetic actuator configured for switching the electrical apparatus, notably for moving separable electrical contacts in order to interrupt the current in the phase conductors.

The power switch T1 may be a transistor, such as a field-effect transistor. As a variant, other technologies could be used, such as a bipolar transistor, or an isolated gate bipolar transistor (IGBT), or any other suitable technology.

The control electrode of the transistor T1 here is connected to another output (denoted Trip) of the processor 36 for switching the transistor T1 between its on and off states when necessary. In the on state, the transistor T1 allows the current to flow through the coil 38.

However, the transistor T1 and the coil 38 may be omitted when the electrical apparatus does not have any protection functions, or when the control of the actuator is carried out by a control circuit distinct from the processor 36.

In other embodiments, the circuit 30 may comprise an auxiliary power supply circuit comprising an auxiliary power supply input V_AUX designed to receive an electrical supply voltage supplied by an external power source.

The auxiliary power supply circuit allows the processor 36 to be powered when the sensors 10 are not able to supply an electrical voltage that is sufficient to make the processor 36 operate normally.

Thus, the auxiliary power supply circuit provides a redundancy in the electrical power supply for the device 2 and, notably, in the power supply for the processor 36.

Preferably, the auxiliary power supply circuit is connected to the power supply rail VMITOP (and hence to the processor 36) via a switch SW1 controlled by the processor 36.

For example, when an electrical power supply fault is detected, the processor 36 commands the closing of the switch SW1 so as to connect the external power supply source to the power supply rail V_AUX (it being understood that said external power supply source is preferably disconnected from the power supply rail VMITOP when the circuit 20 is operating normally).

The auxiliary input V_AUX is however optional and may not be connected to an electrical power source, or may even be omitted from the device 2. In this case, the device 2 may nevertheless comprise an alternative means of supplying electrical power connected to the transistor 36, such as a battery.

However, in many embodiments, the auxiliary voltage input V_AUX and the auxiliary circuit may be omitted.

Generally speaking, the output electrical voltage between the power supply rail and the ground GND is regulated, in other words is maintained more or less constant, by virtue of the action of the processing circuit 14.

For this purpose, the electrical voltage present on the power supply rail is measured by the module 14 by means of a measurement system, such as a voltage divider bridge comprising two resistors Ra and Rb connected between the power supply rail and the ground GND.

For example, the processor 36 is connected to this divider bridge via one of its input terminals.

The voltage measured by means of this measurement system may be converted into a digital signal, for example by means of an analogue-digital converter, which here is integrated into the processor 36, prior to being processed by the processor 36.

As a variant, the voltage measured by means of this measurement system may be left in analogue form, at least a part of the later processing operations being carried out by analogue electronic components, such as comparators.

Figure 4:
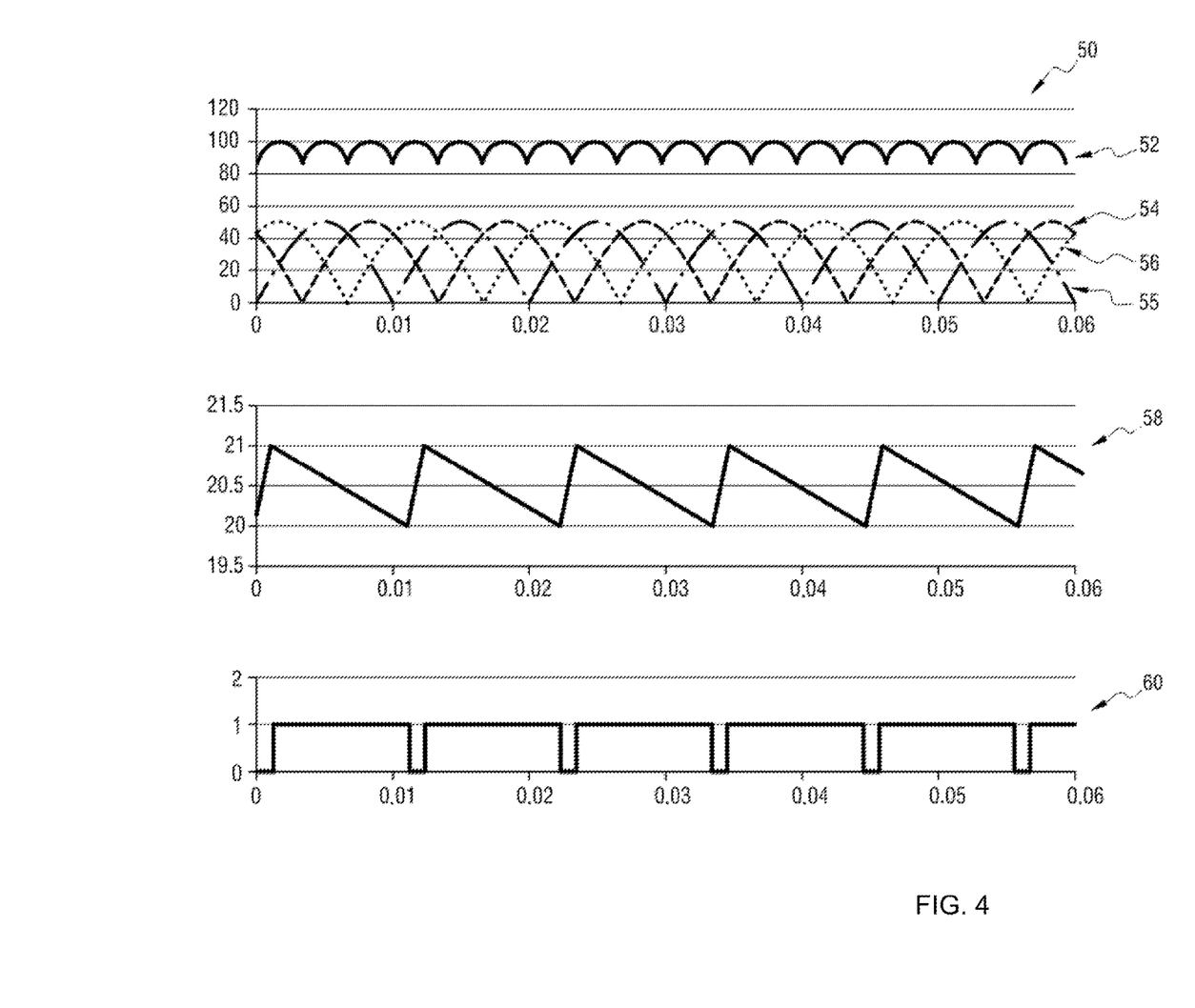
FIG. 4 is a diagram showing the variation of electrical quantities during the operation of the diagnostic device in FIG. 1 under normal conditions.
Figure 5:
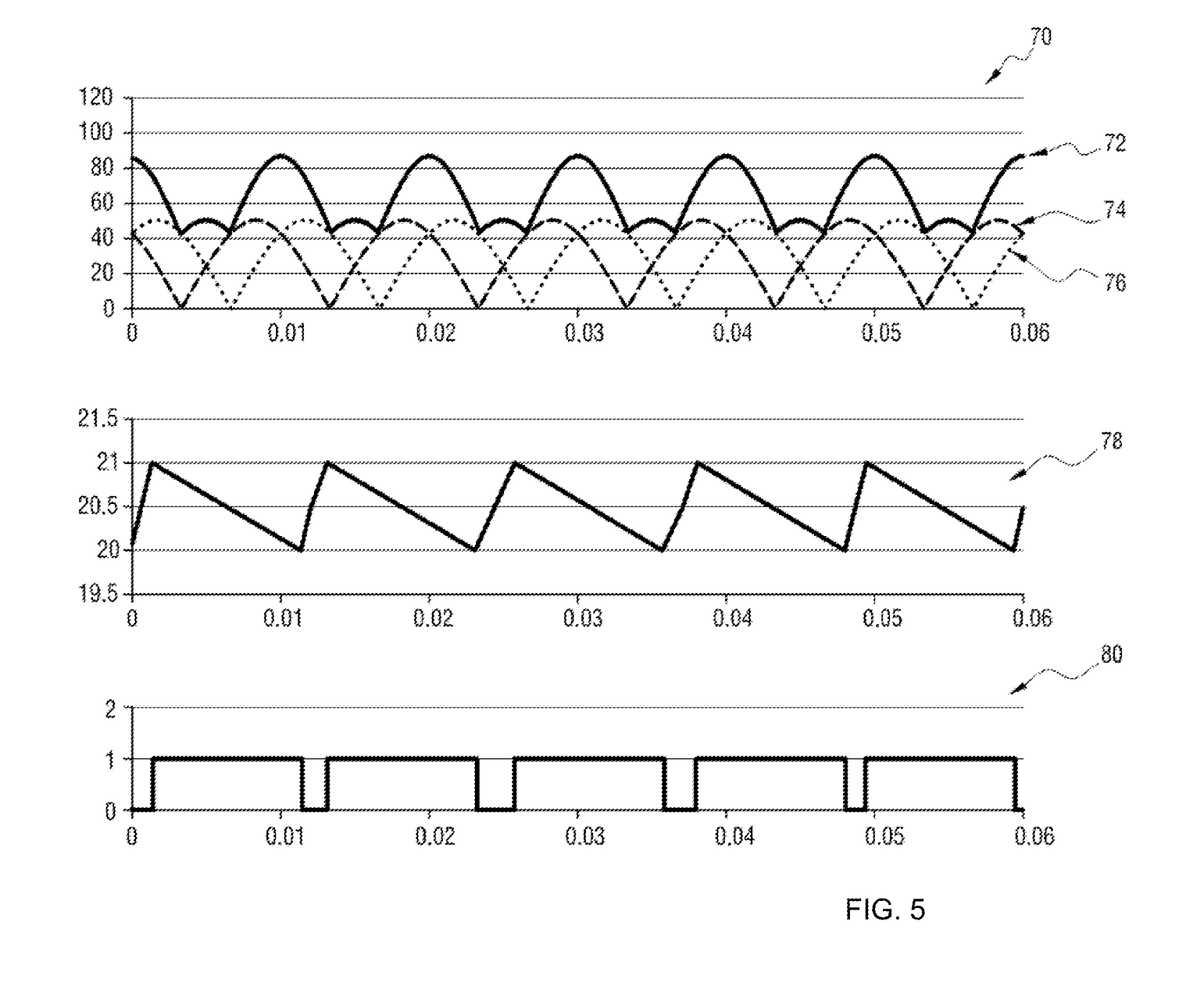
FIG. 5 is a diagram showing the variation of electrical quantities during another phase of operation of the diagnostic device in FIG. 1.

FIGS. 4 and 5 show the variation of electrical quantities in the apparatus 2, respectively in the case of normal operation of the current sensors 10 and in the case of a fault in one of the current sensors 10.

In FIG. 4, the first graph 50 shows the variation over time (abscissa axis, scale labelled in seconds) of the electrical currents coming from the current sensors 10.

More precisely, the curve 52 corresponds to the electrical current measured at the point 34, resultant of the sum of the currents coming from each current sensor 10.

The curves 54, 55 and 56 respectively correspond to each of the currents coming from the current sensors 10 associated with the phase conductors Ip1, Ip2 and Ip3 after rectification by the rectifier bridge 32.

As can be observed, in the case where the line current is a sinusoidal AC current with a frequency of 50 Hz, the curves 54, 55 and 56 showing the phases of the three-phase AC current in the phases Ip1, Ip2 and Ip3 have a period of 20 milliseconds and are phase-shifted with respect to one another by a phase angle of 120 degrees. The three current sensors 10 associated with these phase conductors is operating correctly.

The curve 52, corresponding to the rectified current, exhibits stable values and may potentially oscillate slightly (for example up to 10% or 20% of its maximum amplitude) within an interval of predefined values of currents.

The curve 58 shows the regulated electrical voltage obtained at the output of the electrical power supply circuit 12.

The curve 60 shows the form of the control signal used to control the power switch T2.

For example, the control signal may take two different values: a first value (value 0 on the ordinate axis) for switching the transistor T2 into a non-conducting state, and a second value (value 1 on the ordinate axis) for switching the transistor T2 into a conducting state.

The control signal oscillates between the two values, for example with a periodicity that may vary, the periodicity being dependent on the value of the electrical currents coming from the sensors 10. It will be understood that the duty cycle (for example defined as being the ratio between the time passed during each period in the second value and the total duration of the period) chosen by the processing module 18 is therefore an image of the currents measured by the sensors 10.

In the example illustrated, the duty cycle is greater than or equal to 75% or to 80%, this example not being limiting and other values may be chosen as a variant depending on the circumstances.

As can be seen on the curves 58 and 60, when the transistor T2 is in the on state, the output voltage decreases, whereas when the transistor T2 is in the off state, the output voltage 58 increases.

For example, the output voltage 58 increases in the off state owing to the fact that the energy storage Cm is in the process of being recharged. Conversely, the voltage 58 decreases in the on state owing to the fact that the energy storage Cm is being discharged, notably due to the fact that part of the stored energy is consumed for powering the active electronic components of the device 2, such as the processor 36.

In this example, owing to the regulation, the voltage 58 remains in the range between 20 volts and 21 Volts.

FIG. 5 shows similar curves for the same device 2 in the case where one of the current sensors 10 develops a fault and ceases to deliver an electrical current.

In the example illustrated, it is the current sensor 10 associated with the phase conductor Ip2 which develops a fault and does no longer then deliver any electrical current.

In FIG. 5, the graph 70 shows the variation over time (abscissa axis, scale labelled in seconds) of the electrical currents coming from the current sensors 10.

The curves 72, 74 and 76 of the graph 70 respectively correspond to the curves 52, 54 and 56 of the graph 50 in FIG. 4.

In contrast, the graph 70 does not comprise any curve comparable with the curve 55, since the corresponding current sensor 10 has malfunctioned and is no longer generating any electrical current.

As a consequence, the total current (curve 72) has a lower amplitude and the amplitude variations are much larger (for example up to 50% or more of the maximum amplitude).

In order to compensate for this change, while at the same time continuing to provide the regulation of the output electrical voltage, the processing module 18 automatically modifies the switching parameters of the transistor T2, which corresponds to a modification of the duty cycle. Indeed, it will be understood that the duty cycle is the image of the operating voltage of the regulation closed-loop controlled onto the image of the voltage of the power supply rail VMITOP measured by means of the divider bridge formed by the resistors Ra and Rb.

Thus, as can be seen on the curves 78 and 80, which respectively correspond to the curves 58 and 60, the duty cycle is reduced in order to allow the output voltage to conserve a form and amplitudes close or even identical to those presented in the normal situation where the current sensors 10 are operating normally (curve 60).

By monitoring the switching duty cycle of the transistor T2 (for example its value, or its variation over time), it is thus possible to detect the appearance of a fault in a current sensor 10.

This example is given for the purposes of illustration and does not prevent the embodiments of the invention from being implemented for detecting other types of fault in a current sensor, such as a simultaneous fault in several current sensors 10, or a current sensor 10 delivering erroneous values.

Figure 3:
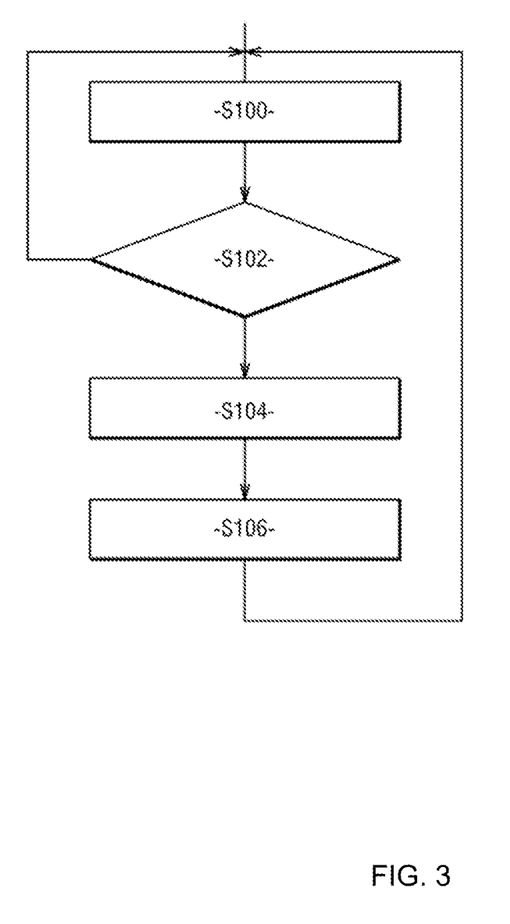
FIG. 3 is a flow diagram of a method of operation of the diagnostic device in FIG. 1.

One example of a method of operation of the diagnostic device 2 is now described with reference to FIG. 3.

Initially, the electrical apparatus is operating and drawing at least a part of its electrical power supply from the current flowing in the line conductors, by virtue of the current sensors 10. The control circuit 14 regulates the output electrical voltage delivered by the electrical power supply circuit 12 by controlling the power switch or switches (T2) with a suitable control signal.

During the step S100, the device 2 automatically determines (here by means of the second processing module 16) the duty cycle used for controlling the electrical power supply circuit 12. The step S100, together with the method, may be triggered periodically.

During a step S102, the module 20 analyses the duty cycle determined in order to identify a fault coming from one of the current sensors 10.

In the case where no failure condition has been identified, the method then stops until the next execution of the step S100.

In the opposite case, a failure condition is said be identified.

For example, during the step S104, an alarm message is generated by the module 22.

Optionally, during the step S106, the operation of all or part of the electrical apparatus may be interrupted, for example by switching the electrical apparatus into an electrically open state, in order to avoid a situation in which it would no longer be able to detect an electrical fault in the installation. Indeed, the electrical installation 4 would then no longer be protected.

For example, for this purpose, a close command can be sent to the transistor T1 in order to supply the coil 38 of the actuator and thus trigger the electrical apparatus by opening its electrical contacts.

As a variant, the steps could be executed in a different order. Certain steps could be omitted. The example described does not prevent, in other embodiments, other steps from being implemented jointly and/or sequentially with the steps described.

Generally speaking, the diagnostic module 20 may be configured in various ways for analysing the data relating to the switching of the power switch (notably the switching duty cycle of the transistor T2).

According to one possibility, the analysis (step S100) may, as previously explained, be directly carried out using the information on the switching duty cycle.

More generally, a numerical index representative of the switching duty cycle may also be used, such as an average value of the switching duty cycle, or any other appropriate statistical representation.

For example, a numerical index representative of the value of the duty cycle may be determined during the step S100 by the second processing module 16, for example by collecting several samples of the control signal for a predefined duration, then by calculating an average value of the control signal. Thus, it is this numerical index which is the object of the analysis (of the comparison) during the step S102.

The average is performed on a set of values taken over a predefined period of time, for example over a period corresponding to several periods of the current flowing in the phase conductors.

In addition, as previously explained, the switching duty cycle may be estimated based on measured electrical quantities, such as the current flowing in the power switch, or the average energy sampled in the energy storage Cm.

As far as the analysis implemented during the step S102 is concerned, it may be observed that, in general, if one of the current sensors 10 is faulty, the incoming electrical current at the input of the power supply circuit 12 is lower than when all the current sensors 10 are operating normally. Indeed, the capacitor Cm will take longer to recharge, all other things being equal.

Henceforth, the module 18 will be obliged to modify the switching parameters in order to continue regulating the output voltage at the predefined setpoint value. This change has an influence on the form of the control signal and hence on the duty cycle.

In certain embodiments, during the analysis, the duty cycle may be compared with one or with several reference values in order to determine whether one or more current sensors 10 have an abnormal behaviour revealing a fault.

Depending on the result of the comparison, a failure condition will be identified or otherwise. For example, if the duty cycle determined is substantially different from an expected value, then a failure condition will be considered as being identified.

The reference value may, for example, be defined as a function of the quantity of electrical current that the circuit 12 should theoretically receive if the current sensors 10 are operating normally.

The reference values may be chosen from amongst a plurality of predefined reference values as a function of the amplitude of the electrical currents flowing in the phase conductors.

For example, several current intervals are predefined, and with each of them is associated a reference value. In practice, during the operation, the amplitude of the currents is measured by the current sensors 6 or 10, then one of these intervals is selected as a function of the measured amplitude, so as to obtain the corresponding reference value.

These reference values may come from tables constructed in advance by the constructor of the apparatus and corresponding to known operating conditions, obtained for example by calibration, for a given number of current sensors 10.

These reference values and/or these tables can be stored in a memory of the processing circuit 14.

Alternatively, the analysis may comprise an analysis of the variation of the duty cycle over time, for example for detecting an abnormal variation indicating a modification of the quantity of current received at the input of the power supply 2 with respect to a history of values (values of the duty cycle for preceding moments in time).

This analysis of the variation over time may be carried out by means of an infinite pulse response filter, or recursive pulse filter, implemented by the device 2.

As a variant, analysis of the variation over time may be carried out using a machine learning system, such as a classification system pre-programmed by a learning phase.

This system may be implemented by the device 2, and may be based on a learning database which can be stored in memory in the device 2, or in a remote database accessible via a communications link.

According to other embodiments, the analysis may take into account values of current measured independently by the first group of current sensors 6, or even by also taking into account measurement information coming from the processing circuit 8 and coming indirectly from these same sensors 6.

For example, the module 20 may be configured for comparing the duty cycle determined by the module 18 with a theoretical index calculated using the values of current measured by the first group of current sensors 6.

For example, the determination of the theoretical index may be carried out based on the fabrication of several products each constructed so as to be representative of the production tolerances (min/max products). In each of these products, malfunctions of one or more power supply sensors are forced or simulated and the image of the duty cycle is recorded. From these recordings, a range of acceptability is generated as a function of the measured current value or values. The devices for which the duty cycle does not fall within the range thus generated are considered as faulty and an alarm signal is generated.

This facilitates, notably, the identification of the malfunctioning current sensor.

By virtue of the invention, the diagnostic device 2 according to the various embodiments allows an operational anomaly in one of the current sensors 10 to be detected, which anomaly would be likely to compromise the correct operation of the electrical apparatus.

This detection is implemented by simply, for example, using the existing architecture of the electrical apparatus (sensors and processing circuits) and basing it on information which is furthermore measured by the control circuit.

The detection is therefore easier to implement than if the electrical quantities measured by each of the current sensors 10 had been analysed in detail.

Optionally, making use of the measurement data coming from the first group of sensors 6 and from the processing circuit 8 for carrying out the comparison allows the diagnosis to be refined and, notably, the current sensor or sensors 10 that are malfunctioning to be identified.

Figure 6:
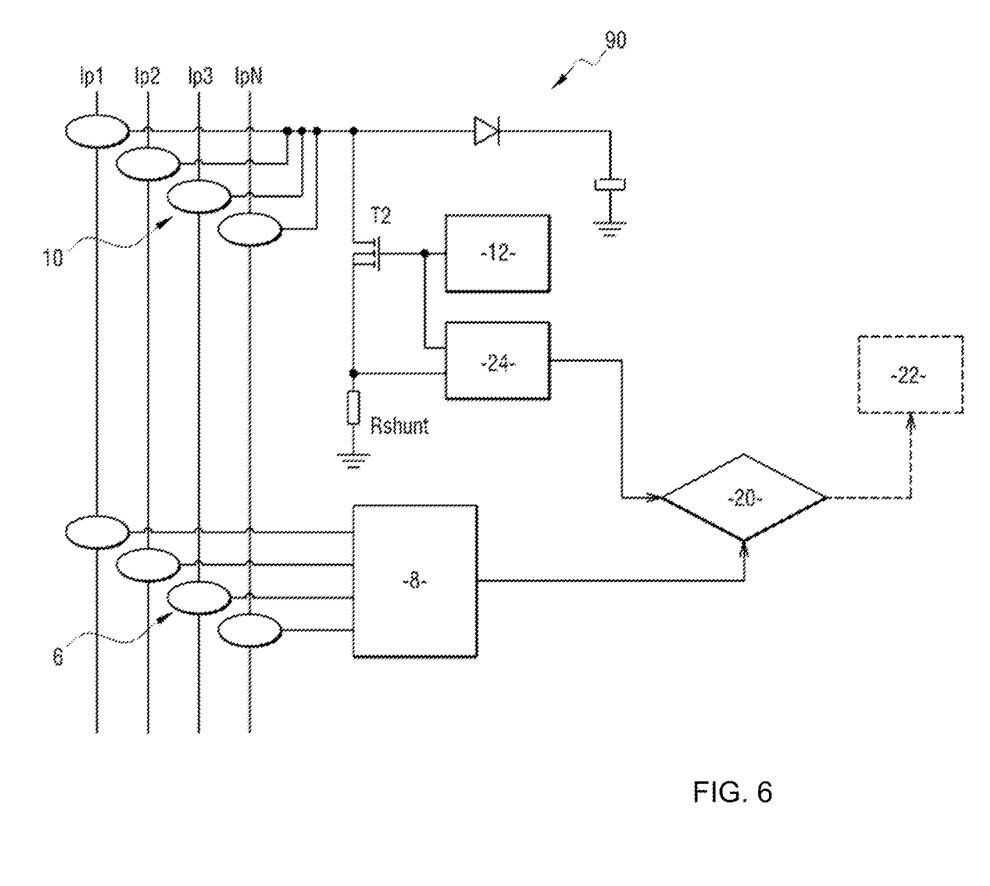
FIG. 6 shows schematically another embodiment of the diagnostic device in FIG. 1.

FIG. 6 shows another embodiment of the circuit in FIG. 2.

In this new embodiment, the circuit 30 is replaced by a circuit 90 which is for the most part similar, or even identical, but which differs from the circuit 30 in that it comprises a measurement resistor, denoted $R_{shunt}$, connected between the transistor T2 and the ground GND, and a measurement circuit 24 coupled to the measurement resistor $R_{shunt}$.

This measurement circuit 24 and this measurement resistor $R_{shunt}$ allow the electrical current flowing through the transistor T2 when it is in the on state to be measured and thus an image of the total current delivered by the current sensors 10 at the common connection point 34 to be obtained. This current here corresponds to the current depicted by the curves 52 and 72 in FIGS. 3 and 4, respectively.

In this embodiment, the diagnostic module 20 is programmed for detecting a failure condition by comparing the electrical current coming from the sensors 10 of the second group (i.e. the sensors used for the electrical power supply) with the current coming from the current sensors 6 of the first group (the measurement sensors), the values and/or the waveforms of the current coming from the current sensors 6 then serving as a reference for the comparison.

Thus, if the current coming from the sensors 10 differs from the reference current coming from the sensors 6 (for example, if the amplitude exhibits a difference greater than a predefined threshold with respect to the reference values), then the diagnostic module 20 identifies this difference and automatically determines that at least one of the sensors 10 of the second group is malfunctioning.

In certain variants, the measurement circuit 24 may be integrated into the processing circuit 8 or be at least partly implemented by the processing circuit 8.

According to yet another embodiment, able to be implemented independently of all or part of the embodiments previously described, the fault detection method based on a comparison of the current coming from the sensors 10 and on the current coming from the sensors 6 may be used in place of the method previously described based on the analysis of the duty cycles.

In other words, the failure condition is then detected solely by this comparison between the current coming from the sensors 10 and the reference current coming from the sensors 6 rather than using the duty cycles.

In this case, a method for identifying a current sensor then comprises steps consisting in:
measuring the current coming from the current sensors 6 from the first group of sensors, so as to obtain a value of reference current;
measuring the current coming from the current sensors 10 of the second group of sensors;
comparing the current coming from the current sensors 10 with the reference value;
identifying a failure condition if the current coming from the current sensors 10 differs (for example by greater than a predefined difference) from the reference value.

These steps may be repeated over time, for example periodically, or continually.

Any feature of one of the embodiments or variants described hereinabove may be implemented in the other embodiments and variants described.

The invention claimed is:

1. A method for identifying a malfunctioning current sensor in an electrical apparatus, in which an electrical power supply of the electrical apparatus is at least partly supplied by a switch-mode electrical power supply circuit connected to at least one current sensor which samples an electrical current in a phase conductor of an electrical installation, the power supply circuit delivering a regulated electrical voltage, the method comprising:
   determining a switching duty cycle of a power switch of the switch-mode electrical power supply;
   analysing the switching duty cycle determined; and
   identifying a failure condition if the behaviour of the switching duty cycle is representative of a failure of at least one of the current sensors.

2. The method according to claim 1, wherein analysing the switching duty cycle comprises comparing the switching duty cycle determined with a predetermined reference value.

3. The method according to claim 2, wherein the predetermined reference value is chosen as a function of an amplitude of current flowing in the phase conductors.

4. The method according to claim 1, wherein analysing the switching duty cycle comprises analysing a variation of the duty cycle over time with respect to a history of past values.

5. The method according to claim 4, wherein analysing the variation over time is carried out by an infinite pulse response filter.

6. The method according to claim 1, wherein analysing the switching duty cycle comprises comparing the switching duty cycle determined with a theoretical value of the comparison duty cycle calculated based on values of current measured by one or more additional current sensors.

7. The method according to claim 1, wherein the duty cycle determined is an average value of the switching duty cycle averaged over a predefined period of time.

8. The method according to claim 1, wherein an alarm is automatically raised if a failure condition is identified.

9. The method according to claim 1, wherein the electrical apparatus is an electrical protection apparatus, and wherein the apparatus is automatically triggered if a failure condition is identified.

10. The method according to claim 1, wherein the method for identifying a malfunctioning current sensor further comprises:
    measuring a value of a total current flowing in the phase conductor or conductors of the electrical installation, by one or more additional current sensors;
    measuring a total current coming from said at least one current sensor, then comparing values of the total current measured with the values of current measured by the additional sensor or sensors; and
    identifying a failure condition if a difference between the values of total current coming from said at least one current sensor and the values of current measured by the additional sensor or sensors is greater than a predefined threshold.

11. The method according to claim 7, wherein the predefined period of time is a period of time corresponding to several periods of current flowing in the phase conductors.

12. The method claim 9, wherein the electrical protection apparatus is a circuit breaker.

13. An electrical apparatus, comprising:
    at least one current sensor configured to sample an electrical current in a phase conductor of an electrical installation, and
    a switch-mode electrical power supply circuit connected to said at least one current sensor and configured for delivering a regulated electrical voltage for powering the electrical apparatus,
    wherein the electrical apparatus comprises a diagnostic device configured to implement:
    determining a switching duty cycle of a power switch of the switch-mode electrical power supply;
    analysing the switching duty cycle determined; and
    identifying a failure condition if the behaviour of the switching duty cycle is representative of a failure of at least one of the current sensors.

* * * * *